(12) United States Patent
Kim et al.

(10) Patent No.: US 7,306,002 B2
(45) Date of Patent: Dec. 11, 2007

(54) SYSTEM AND METHOD FOR WET CLEANING A SEMICONDUCTOR WAFER

(76) Inventors: Yong Bae Kim, 1114 Steeplechase La., Cupertino, CA (US) 95014; Jungyup Kim, 350 Elan Village La., #104, San Jose, CA (US) 95134; Yong Ho Lee, 44950 Pawnee Dr., Fremont, CA (US) 94539; In Kwon Jeong, 20425 Via Paviso, #D14, Cupertino, CA (US) 95014

( * ) Notice: Subject to any disclaimer, the term of this patent is extended or adjusted under 35 U.S.C. 154(b) by 292 days.

(21) Appl. No.: 10/336,631

(22) Filed: Jan. 4, 2003

(65) Prior Publication Data
US 2004/0132318 A1 Jul. 8, 2004

(51) Int. Cl.
*B08B 3/12* (2006.01)
(52) U.S. Cl. ............... 134/184; 134/137; 134/140; 134/142; 134/147; 134/148; 134/151; 134/157; 134/193; 134/196; 134/198
(58) Field of Classification Search ............ 134/1, 134/184, 193, 196, 198, 137, 140, 142, 147, 134/148, 151, 157, 902
See application file for complete search history.

(56) References Cited

U.S. PATENT DOCUMENTS

| | | | |
|---|---|---|---|
| 4,064,885 A * | 12/1977 | Dussault et al. ......... 134/58 R |
| 5,975,098 A * | 11/1999 | Yoshitani et al. ........... 134/148 |
| 6,039,059 A * | 3/2000 | Bran ......................... 134/105 |
| 6,363,623 B1 | 4/2002 | Abraham | |
| 6,431,184 B1 * | 8/2002 | Taniyama .................. 134/1.3 |
| 6,460,552 B1 * | 10/2002 | Lorimer .................... 134/148 |
| 6,491,764 B2 * | 12/2002 | Mertens et al. ............ 134/36 |
| 6,800,546 B2 * | 10/2004 | Konishi et al. ............ 438/623 |
| 6,845,259 B2 * | 1/2005 | Pacetti et al. ............. 600/407 |
| 2002/0062840 A1 | 5/2002 | Berhaverbeke et al. | |
| 2002/0066475 A1 | 6/2002 | Verhaverbeke et al. | |
| 2002/0185164 A1 * | 12/2002 | Tetsuka et al. ........... 134/148 |
| 2003/0192570 A1 * | 10/2003 | Thakur et al. ............ 134/1.3 |

FOREIGN PATENT DOCUMENTS

| | | | |
|---|---|---|---|
| JP | 11-26367 | * | 1/1999 |
| JP | 11-260778 | * | 11/1999 |
| JP | 2000-150439 | | 5/2000 |

* cited by examiner

*Primary Examiner*—M. Kornakov
(74) *Attorney, Agent, or Firm*—Thomas H. Ham; Wilson & Ham

(57) ABSTRACT

A system and method for cleaning a substrate, such as a semiconductor wafer, utilizes a rotatable wafer supporting assembly with a cylindrical body to provide stability for the substrate being cleaned, even at high rotational speeds. The rotatable wafer supporting assembly may include wafer holding mechanisms with pivotable confining members that are configured to hold the substrate using centrifugal force when the wafer supporting assembly is rotated. In an embodiment, the cleaning system may include a positioning system operatively connected to an acoustic transducer to provide meaningful control of the acoustic energy applied to a surface of the substrate by selectively changing the distance between the acoustic transducer and the substrate surface so that the substrate can be cleaned more effectively.

15 Claims, 14 Drawing Sheets

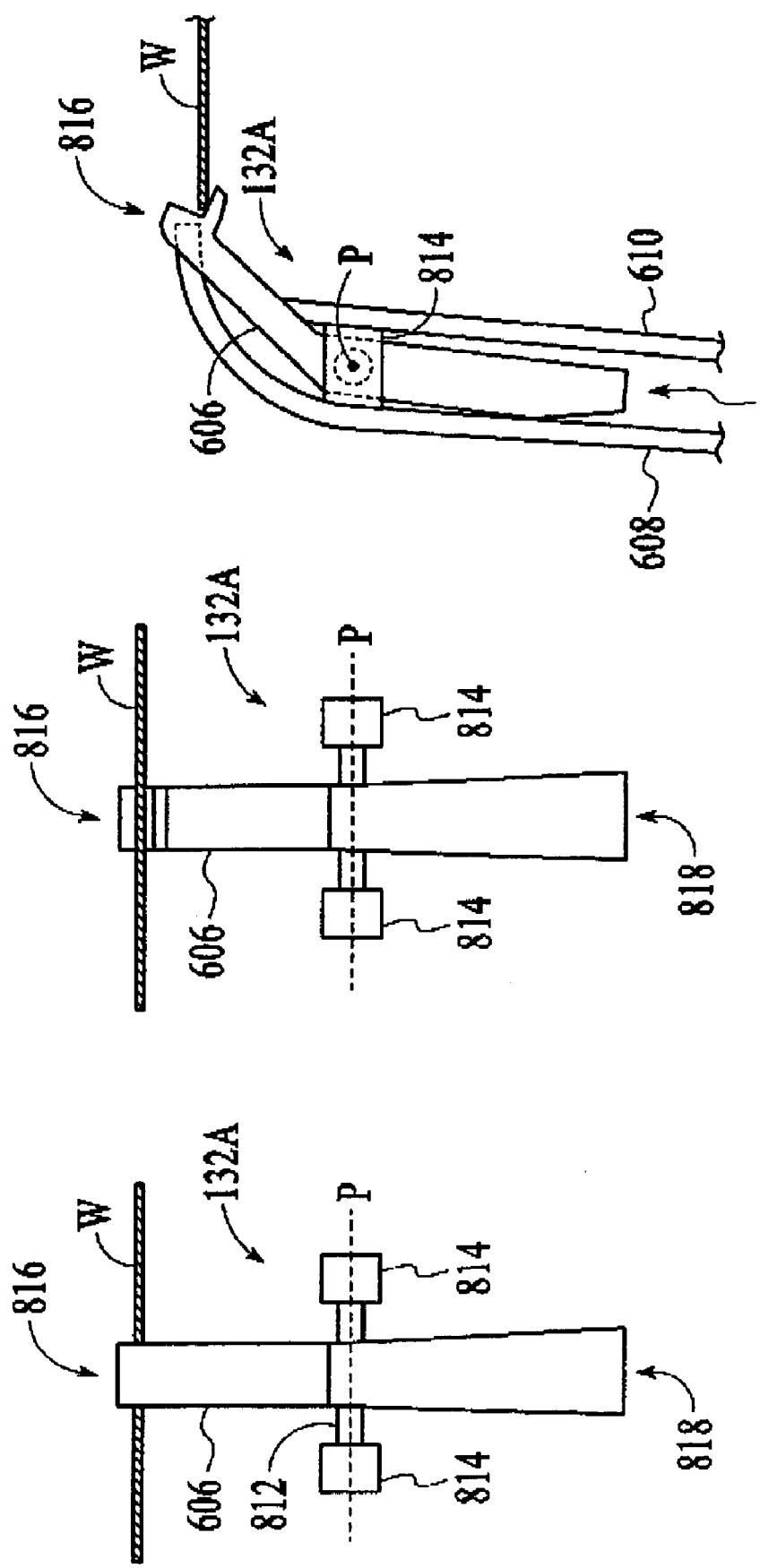

SYSTEM AND METHOD FOR WET CLEANING A SEMICONDUCTOR WAFER

FIELD OF THE INVENTION

The invention relates generally to semiconductor fabrication processing, and more particularly to a system and method for wet cleaning a semiconductor wafer.

BACKGROUND OF THE INVENTION

As semiconductor devices are aggressively scaled down, the number of photoresist masking steps used in the photolithography process has significantly increased due to various etching and/or implanting requirements. Consequently, the number of post-masking cleaning steps has also increased. After a layer of photoresist is patterned on a semiconductor wafer and then subjected to a fabrication process, such as plasma etch or ion implantation, the patterned photoresist layer must be removed without leaving photoresist residue, which may detrimentally affect the resulting semiconductor device with respect to performance and reliability.

Traditionally, semiconductor wafers have been cleaned in batches by sequentially immersing the wafers into baths of different cleaning fluids, i.e., wet benches. However, with the advent of sub-0.18 micron geometries and 300 mm wafer processing, the use of batch cleaning has increased the potential for defective semiconductor devices due to cross-contamination and residual contamination. In order to mitigate the shortcomings of batch cleaning processes, single-wafer spin-type cleaning techniques have been developed. Conventional single-wafer spin-type cleaning systems typically include a single fluid delivery line to dispense one or more cleaning fluids, such as deionized (DI) water, standard clean 1 (SC1) solution and standard clean 2 (SC2) solution, onto a surface of a semiconductor wafer in an enclosed environment. After the semiconductor wafer is cleaned, the wafer is usually rinsed using DI water and then spin-dried using Isopropyl Alcohol (IPA) by rotating the wafer at a high rotational speed.

An important aspect of a single-wafer spin-type cleaning system is the rotating of the semiconductor wafer. Since the semiconductor wafer is typically rotated at high speeds, especially during the spin-drying process, the mechanisms of the single-wafer spin-type cleaning system that hold and rotate the semiconductor wafer must be well designed. Inferior design of these mechanisms may cause instability at high rotational speeds, which may result in damage of the semiconductor wafer being cleaned.

Some conventional single-wafer spin-type cleaning systems include an acoustic transducer to apply megasonic or ultrasonic energy to the front surface of a semiconductor wafer to assist in the cleaning of the wafer. However, direct application of acoustic energy to the front surface of the semiconductor wafer where delicate patterns are formed may damage these patterns. Consequently, the acoustic transducer in some conventional single-wafer spin-type cleaning systems is positioned to apply megasonic or ultrasonic energy to the back surface of the semiconductor wafer. Since the acoustic energy must travel through the semiconductor wafer to reach the front surface of the wafer, the acoustic energy applied to the back surface of the wafer is attenuated to reduce the possibility of damage to the delicate patterns formed on the front surface of the wafer.

A concern with conventional single-wafer spin-type cleaning systems with an acoustic transducer is that the acoustic energy generated by the acoustic transducer is usually applied uniformly to the front or back surface of a semiconductor wafer without any control of the intensity of the acoustic energy being applied to the wafer surface. Consequently, the amount of applied acoustic energy at a particular region of a semiconductor wafer cannot be controlled.

In view of the above-described concerns, there is a need for a single-wafer spin-type cleaning system and method for wet cleaning a semiconductor wafer that provides increased stability at high rotational speed and increased control of acoustic energy that is applied to the semiconductor wafer.

SUMMARY OF THE INVENTION

A system and method for cleaning a substrate, such as a semiconductor wafer, utilizes a rotatable wafer supporting assembly with a cylindrical body to provide stability for the substrate being cleaned, even at high rotational speeds. The rotatable wafer supporting assembly may include wafer holding mechanisms with pivotable confining members that are configured to hold the substrate using centrifugal force when the wafer supporting assembly is rotated. In an embodiment, the cleaning system may include a positioning system operatively connected to an acoustic transducer to provide meaningful control of the acoustic energy applied to a surface of the substrate by selectively changing the distance between the acoustic transducer and the substrate surface so that the substrate can be cleaned more effectively.

A cleaning system in accordance with one embodiment includes a rotatable cylindrical structure, a number of substrate holding mechanisms, a rotational drive mechanism and a fluid dispensing device. The rotatable cylindrical structure has an opening to accommodate the substrate. The substrate holding mechanisms are attached to the cylindrical structure to hold the substrate near the opening of the cylindrical structure. The rotational drive mechanism is connected to the cylindrical structure to rotate the cylindrical structure and the substrate holding mechanisms, as well as the substrate held by the substrate holding mechanisms. The fluid dispensing device is positioned relative to the cylindrical structure to dispense a cleaning fluid onto one of first and second surfaces of the substrate.

A cleaning system in accordance with another embodiment of the invention includes a substrate supporting assembly, a fluid dispensing device, an acoustic energy generator and a positioning system. The substrate supporting assembly is configured to hold the substrate. The fluid dispensing device is positioned relative to the substrate supporting assembly to dispense a cleaning fluid onto one of first and second surfaces of the substrate. The acoustic energy generator is positioned relative to the substrate supporting assembly to apply acoustic energy to one of the first and second surfaces of the substrate. The positioning system is operatively connected to the acoustic energy generator to selectively position the acoustic energy generator with respect to the substrate such that the intensity of the acoustic energy at different areas of the substrate can be controlled.

A method for cleaning a substrate in accordance with one embodiment of the invention includes placing the substrate on substrate holding mechanisms that are attached to a cylindrical structure such that the substrate is supported near an opening of the cylindrical structure, rotating the cylindrical structure and the substrate holding mechanisms about a rotational axis, and dispensing a cleaning fluid onto one of first and second surfaces of the substrate to clean the substrate. The rotating of the cylindrical structure and the substrate holding mechanisms includes holding the substrate using the substrate holding mechanisms such that the substrate is also rotated along with the cylindrical structure and the substrate holding mechanisms.

A method for cleaning a substrate in accordance with another embodiment of the invention includes placing the substrate on a substrate supporting assembly, dispensing a cleaning fluid onto one of first and second surfaces of the substrate, selectively positioning an acoustic energy generator relative to the substrate, and generating acoustic energy from the acoustic energy generator to apply the acoustic energy to one of the first and second surfaces of the substrate.

Other aspects and advantages of the present invention will become apparent from the following detailed description, taken in conjunction with the accompanying drawings, illustrated by way of example of the principles of the invention.

BRIEF DESCRIPTION OF THE DRAWINGS

FIG. 8 illustrates the external side of a wafer holding mechanism of the wafer supporting assembly.

FIG. 9 illustrates the interior side of the wafer holding mechanism of FIG. 8.

FIG. 10 illustrates a lateral side of the wafer holding mechanism of FIG. 8.

DETAILED DESCRIPTION

Figure 1:
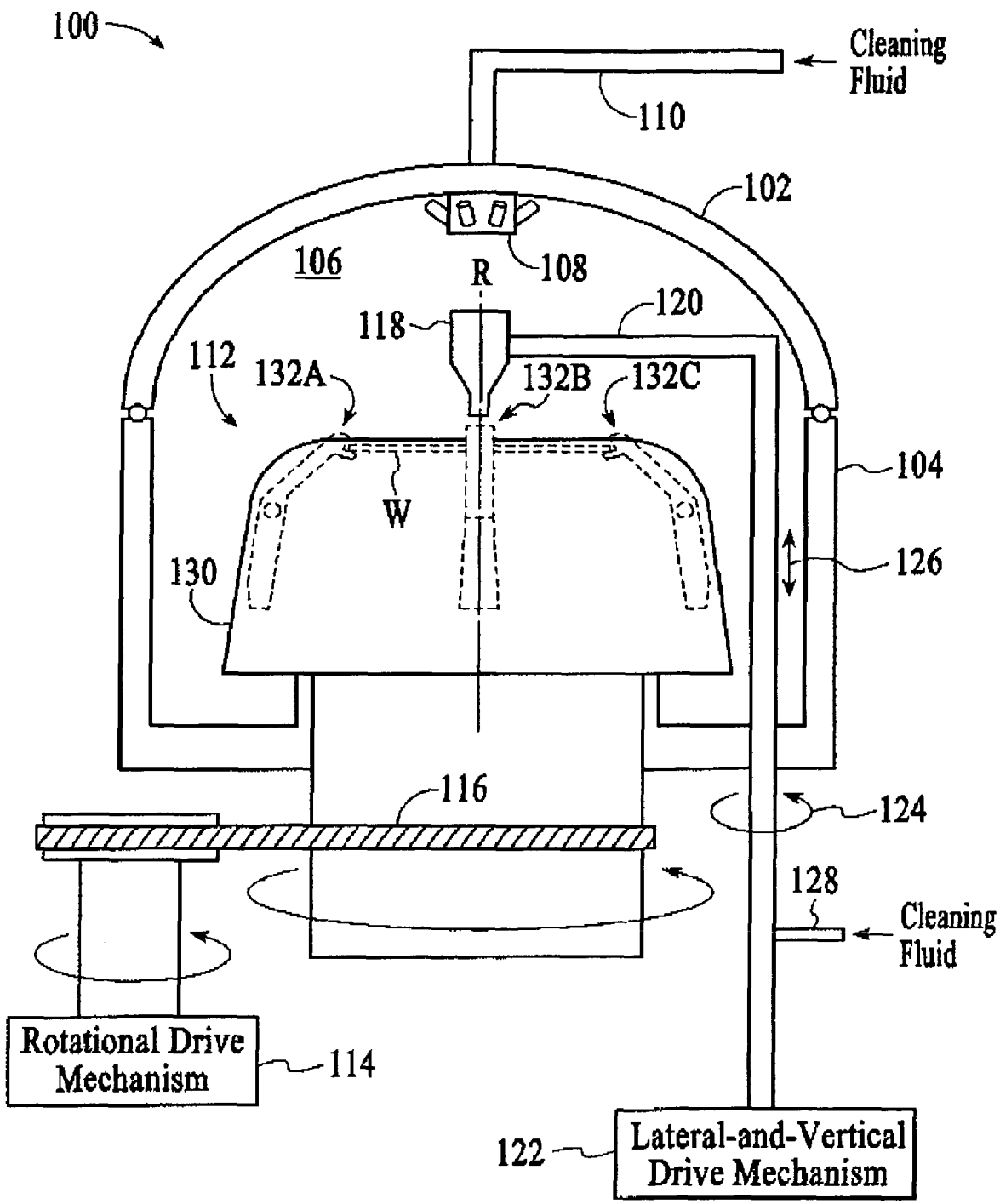
FIG. 1 is a diagram of a single-wafer spin-type cleaning system for cleaning a semiconductor wafer in accordance with an exemplary embodiment of the present invention.

With reference to FIG. 1, a single-wafer spin-type cleaning system 100 in accordance with an exemplary embodiment of the invention is shown. As described in more detail below, the cleaning system 100 is designed to provide stability for a semiconductor wafer W being cleaned, even at high rotational speeds. In addition, the cleaning system 100 is designed to provide meaningful control of an acoustic energy that is applied to the semiconductor wafer so that the wafer can be cleaned more effectively. Furthermore, in some embodiments, the cleaning system 100 is designed to rinse the back surface (i.e., the bottom surface) of the semiconductor wafer in a scanning fashion to reduce or eliminate contaminants, such as particles, on the back wafer surface. Lastly, the cleaning system 100 is designed to be partly self-cleaning so that less manual cleaning of the system is required. Although the cleaning system 100 is described herein as being used to clean a semiconductor wafer, the cleaning system may be used to clean other substrates.

Figure 2:
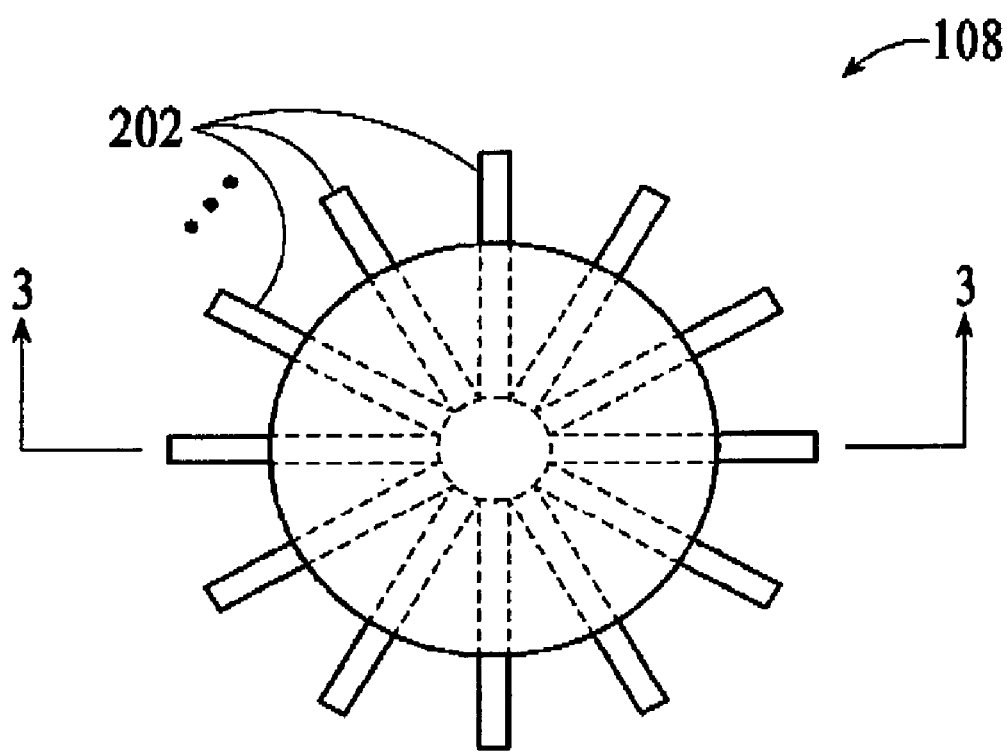
FIG. 2 is a bottom view of a chamber-cleaning device included in the cleaning system of FIG. 1.
Figure 3:
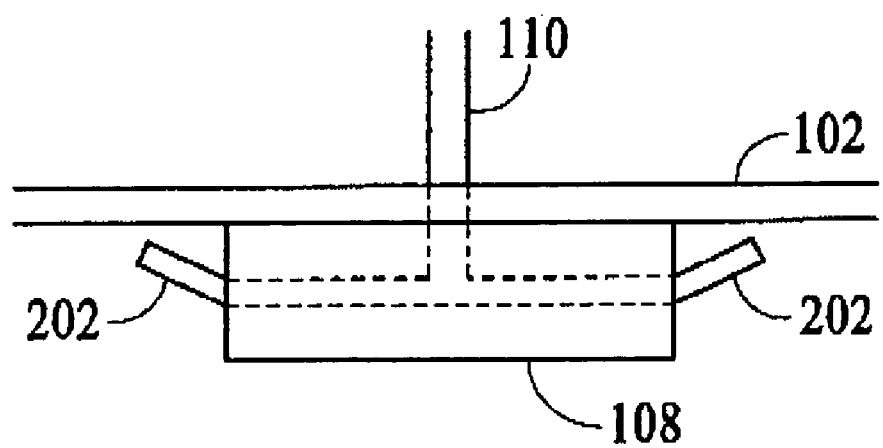
FIG. 3 is a cross-sectional view of the chamber-cleaning device of FIG. 2.

As shown in FIG. 1, the cleaning system 100 includes an upper enclosure structure 102 and a lower enclosure structure 104, which provide an enclosed cleaning chamber 106 when the upper and lower structures are closed. The upper enclosure structure 102 is designed to be raised by a lifting mechanism (not shown) so that the cleaning chamber 106 can be opened, which allows semiconductor wafers to be transferred into and out of the cleaning chamber. The upper enclosure structure 102 may be a dome-like structure that provides a concaved ceiling for the cleaning chamber 106. Attached to the upper enclosure structure 102 is a chamber-cleaning device 108, which is connected to a fluid line 110. The chamber-cleaning device 108 is configured to clean the interior surface of the cleaning chamber 106 using one or more cleaning fluids, such as deionized (DI) water, to remove contaminants and chemical solution residue on the interior chamber surface, which may appear on the interior chamber surface from the cleaning of a semiconductor wafer in the cleaning chamber. As illustrated in FIG. 2, the chamber-cleaning device 108 includes a number of nozzles 202 to spray a cleaning fluid supplied through the fluid line 110 onto the interior surface of the cleaning chamber 106 at or near the top of the cleaning chamber. As shown in FIG. 3, which is a cross-sectional view of the chamber-cleaning device 108 along the line 3-3 in FIG. 2, the nozzles 202 may be angled to spray a cleaning fluid onto the interior chamber surface near the chamber-cleaning device. The sprayed cleaning fluid then flows down the sides of the interior chamber surface, thereby cleaning the sides of the interior chamber surface. The cleaning of the cleaning chamber 106 performed by the chamber-cleaning device 108 reduces the need to manually clean the interior surface of the cleaning chamber.

Figure 4:
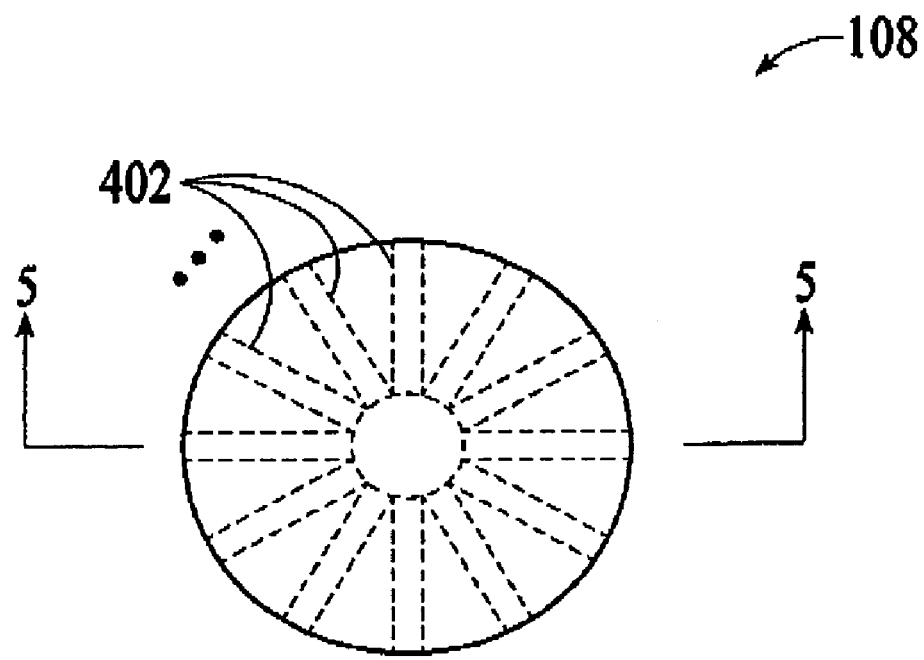
FIG. 4 is a bottom view of the chamber-cleaning device in accordance with an alternative configuration.
Figure 5:
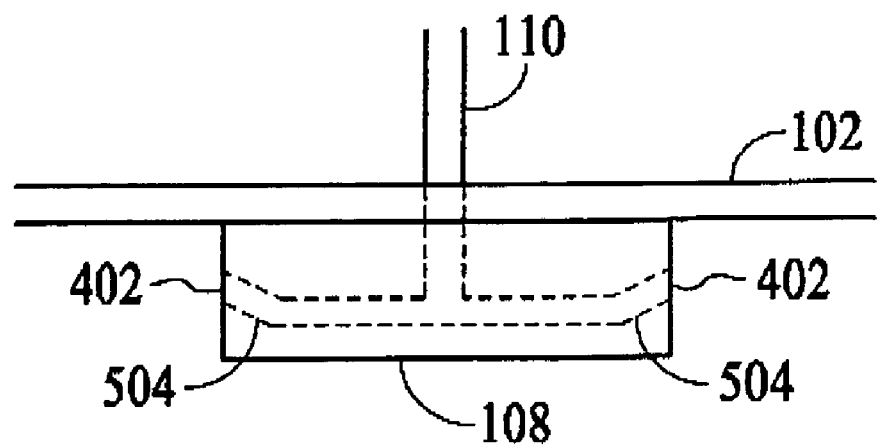
FIG. 5 is a cross-sectional view of the chamber-cleaning device of FIG. 4.

In an alternative configuration, the nozzles 202 of the chamber-cleaning device 108 are replaced with openings 402, as shown in FIG. 4. In this configuration, conduits 504 that lead to the openings 402 are angled, as illustrated in FIG. 5, which is a cross-sectional view of the chamber-cleaning device 108 of FIG. 4 along the line 5-5, so that the cleaning fluid is sprayed at an angle to spray a cleaning fluid onto the interior surface of the cleaning chamber 106 near the chamber-cleaning device 108.

Turning back to FIG. 1, the cleaning system 100 further includes a wafer supporting assembly 112 and a fluid dispensing unit 118, which are located within the cleaning chamber 106. The wafer supporting assembly 112 is designed to securely hold the semiconductor wafer W so that the wafer can be rotated about a rotational axis R for cleaning. The wafer supporting assembly 112 is connected to a rotational drive mechanism 114, which can rotate the wafer supporting assembly and the semiconductor wafer W that is being held by the wafer supporting assembly. As an example, the rotational drive mechanism 114 may be connected to the wafer supporting assembly 112 by a drive belt 116 to rotate the wafer supporting assembly. However, the rotational drive mechanism 114 may be connected to the wafer supporting assembly 112 by other means to rotate the wafer supporting assembly, such as drive chains or gears. The wafer supporting assembly 112 is described in more detail below. The fluid dispensing unit 118 is designed to dispense one or more cleaning fluids onto the front surface (i.e., the top surface) of the semiconductor wafer W being held by the wafer supporting assembly 112. The fluid dispensing unit 118 includes one or more openings to dispense a cleaning fluid onto the front surface of the semiconductor wafer W. The fluid dispensing unit 118 is attached to a mechanical arm 120, which is connected to a lateral-and-vertical drive mechanism 122. The lateral-and-vertical drive mechanism 122 is configured to laterally move the fluid dispensing unit 118 across the semiconductor wafer W in a radial direction to dispense a cleaning fluid over the entire front surface of the wafer by rotating the mechanical arm 120 as indicated by the arrow 124. The lateral-and-vertical drive mechanism 122 is also configured to vertically move the fluid dispensing unit 118 so that the distance between the fluid dispensing unit and the semiconductor wafer W can be increased or decreased by raising or lowering the mechanical arm 120, as indicated by the arrow 126. The fluid dispensing unit 118 is connected to a fluid supply (not shown) via a fluid delivery line 128. The cleaning fluid supplied to the fluid dispensing unit 118 through the fluid delivery line 128 may include one or more of the following fluids: DI water, diluted HF, mixture of $NH_4OH$ and $H_2O$, standard clean 1 or "SC1" (mixture of $NH_4OH$, $H_2O_2$ and $H_2O$), standard clean 2 or "SC2" (mixture HCl, $H_2O_2$ and $H_2O$), ozonated water (DI water with dissolved ozone), known cleaning solvents (e.g., a hydroxyl amine based solvent EKC265, available from EKC Technology, Inc.), and any constituent of these fluids.

Figure 6:
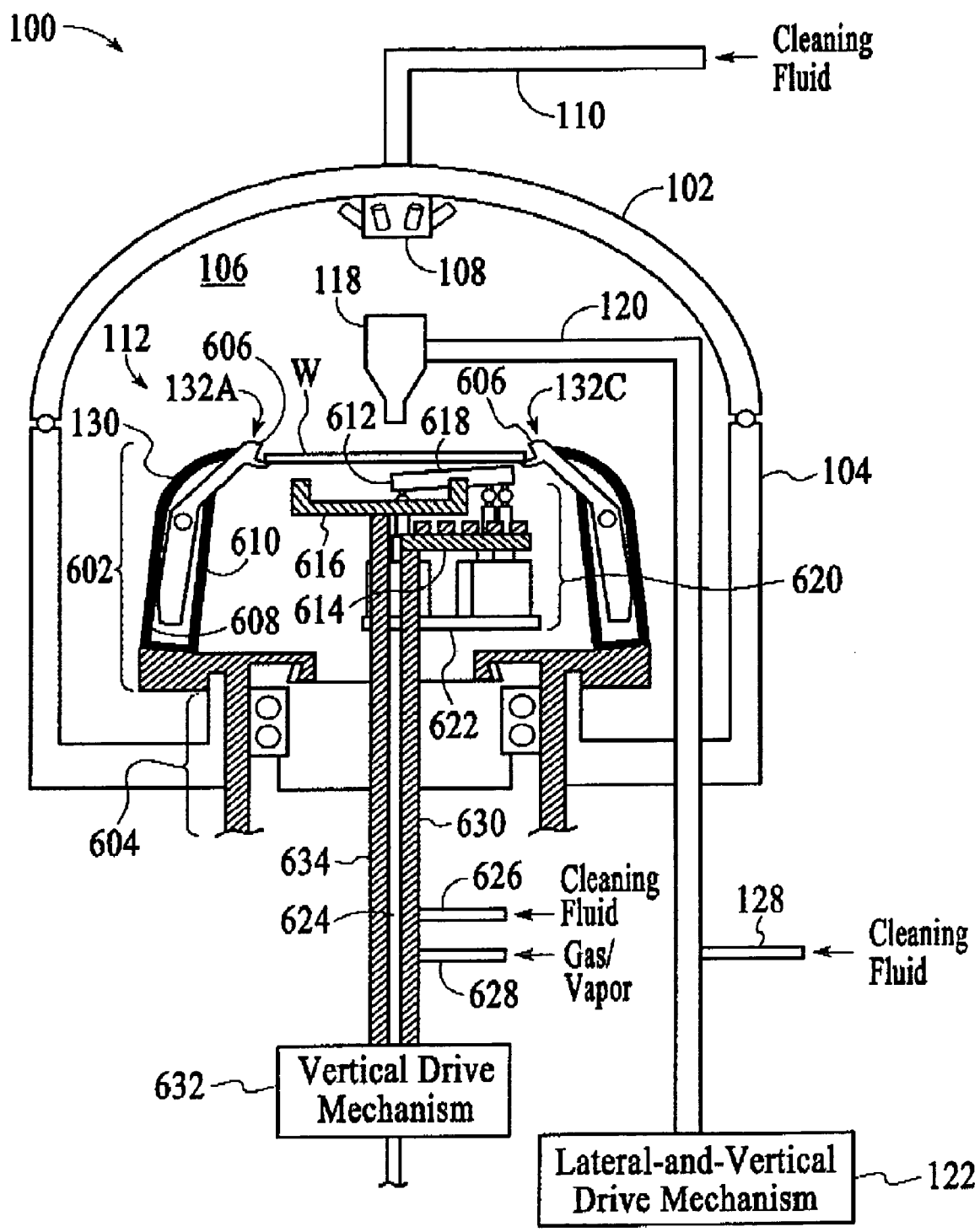
FIG. 6 is another diagram of the cleaning system of FIG. 1.
Figure 7:
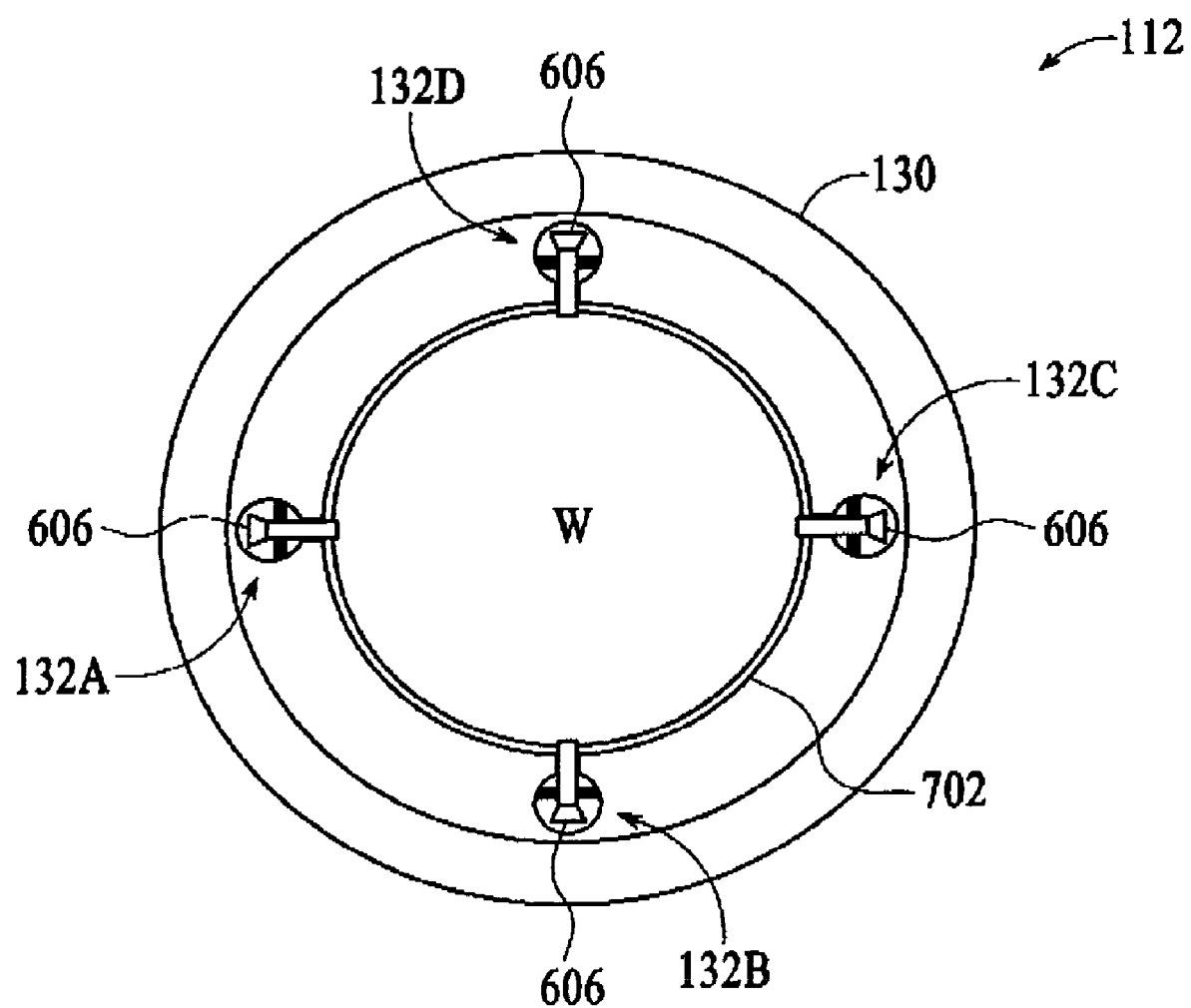
FIG. 7 is a top view of a wafer supporting assembly included in the cleaning system of FIG. 1.

The wafer supporting assembly 112 of the cleaning system 100 includes a cylindrical body 130 and four wafer holding mechanisms 132A, 132B, 132C and 132D (only three wafer holding mechanism are shown in FIG. 1). FIGS. 6 and 7 illustrate cross-sectional and top views of the wafer supporting assembly 112, respectively. As shown in FIG. 6, the cylindrical body 130 includes a bowl-like upper portion 602 and a shaft-like lower portion 604. The bowl-like upper portion 602 includes an opening 702 that is slightly bigger in size than the semiconductor wafer W, as shown in FIG. 7. Thus, the opening 702 can accommodate the semiconductor wafer W within the opening. The wafer holding mechanisms 132A, 132B, 132C and 132D are attached to the bowl-like upper portion 602 to support and hold the semiconductor wafer W within the opening 702 of the bowl-like upper portion 602. In the exemplary embodiment, the wafer holding mechanisms 132A, 132B, 132C and 132D include pivotable confining members 606 that use centrifugal force to apply an inward radial force on the edge of the semiconductor wafer W to securely hold the wafer when the wafer supporting assembly 112 is rotated. Due to the size of the opening 702 of the bowl-like upper portion 602, when the semiconductor wafer W is held by the wafer holding mechanisms 132A, 132B, 132C and 132D, the opening is substantially covered by the wafer such that the front and back surfaces of the wafer are isolated from each other by the cylindrical body 130. Consequently, the back surface of the semiconductor wafer W is protected by the cylindrical body 130 such that most of the used cleaning fluid and other materials (e.g., photoresist residue and particulates) from the front surface of the wafer do not contaminate the back surface of the wafer. Similarly, the front surface of the semiconductor wafer W is protected by the cylindrical body 130 such that most of the used cleaning fluid and other materials from the back surface of the wafer do not contaminate the front surface of the wafer.

As illustrated in FIG. 6, the bowl-like upper portion 602 of the wafer supporting assembly 112 includes an outer sidewall 608 and an inner sidewall 610. The space between the side walls 608 and 610 of the bowl-like upper portion 602 is used to limit the pivoting movements of the confining members 606 of the wafer holding mechanisms 132A, 132B, 132C and 132D, as described below.

Figure 11:
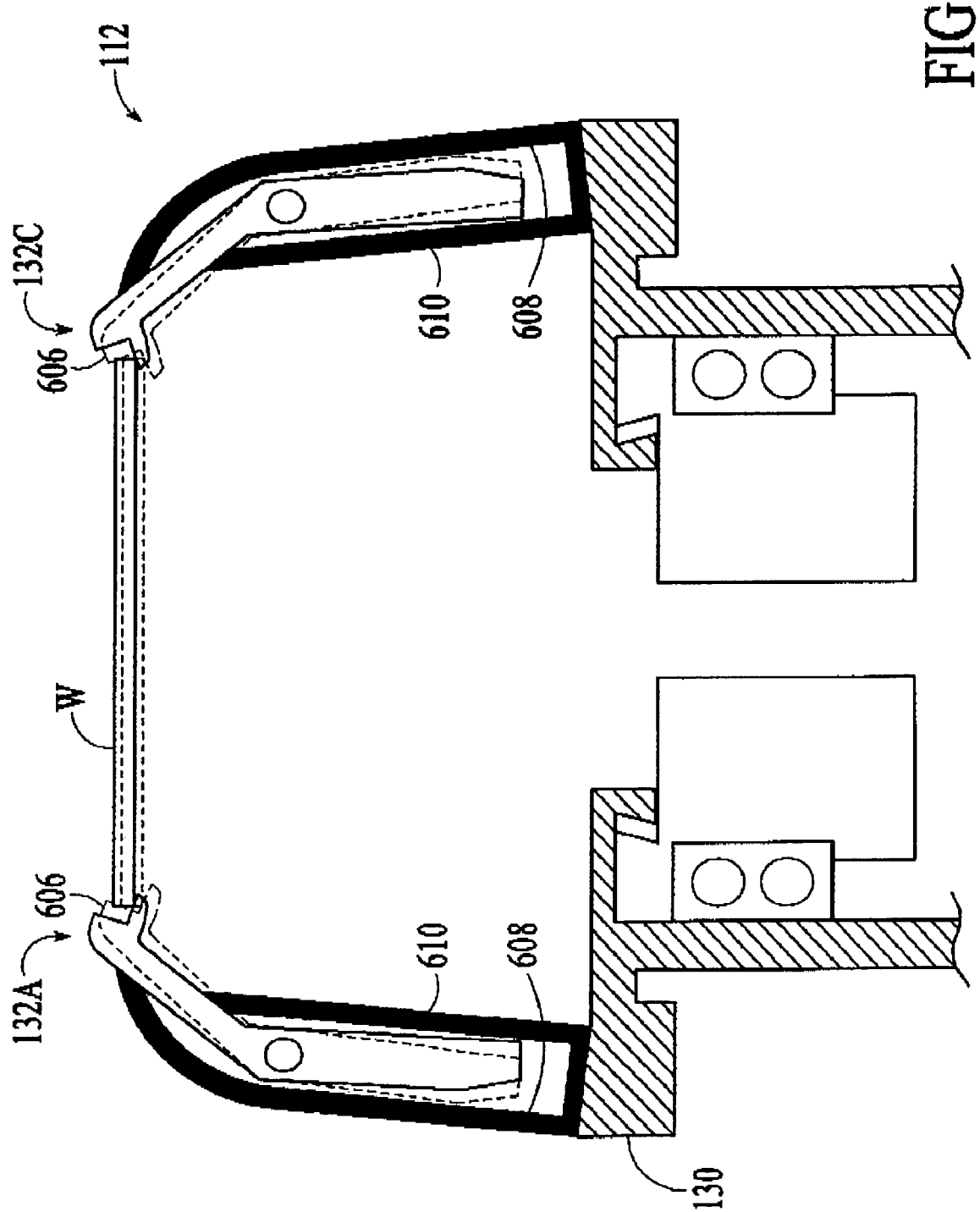
FIG. 11 is a cross-sectional view of the wafer supporting assembly, illustrating the pivoting movements of confining members of the wafer holding mechanisms.

The wafer holding mechanisms 132A, 132B, 132C and 132D of the wafer supporting assembly 112 are structurally similar. Thus, only the wafer holding mechanism 132A is illustrated and described in detail with reference to FIGS. 8, 9 and 10. FIGS. 8 and 9 illustrate the exterior and interior sides of the wafer holding mechanism 132A, respectively, while FIG. 10 illustrates a lateral side of the wafer holding mechanism. The interior side of the wafer holding mechanism 132A is the side that faces the rotating axis R, while the exterior side is the side that faces away from the rotating axis. The wafer holding mechanism 132A includes a confining member 606 with a pivoting pin 812 that extends out of the sides of the confining member. The pivoting pin 812 may be an integrated part of the confining member 606 or a separate part that is inserted into the confining member. The pivoting pin 812 is operatively connected to a pair of pin support structures 814, which are attached to the outer and inner sidewalls 608 and 610 of the cylindrical body 130. The pivoting pin 812 allows the confining member 606 to pivot about a pivoting axis P, i.e., the axis of the pivoting pin. The confining member 606 includes a wafer engaging end 816 and a counterbalance end 818. The pivoting axis P is located between the wafer engaging end 816 and the counterbalance end 818 such that, when the wafer supporting assembly 112 is at rest, the confining member 606 is positioned at a wafer receiving position, as illustrated in FIG. 11. However, when the wafer supporting assembly 112 is being rotated, the confining member 606 is pivoted by the centrifugal force caused by rotation of the wafer supporting assembly to a wafer confining position, as illustrated in FIG. 11 by the phantom confining members. When the wafer supporting assembly 112 is no longer being rotated, the confining member 606 is pivoted back to the original wafer receiving position. The outer and inner sidewalls 608 and 610 limit the pivoting movement of the confining member 606, which prevents the confining member from being pivoted too far in either direction, as illustrated in FIG. 10. In the exemplary embodiment, the confining member 606 is bent such that the pivoting axis P is more distant from the rotational axis R than the wafer engaging end 816. However, the confining member 606 can have other configurations.

Figure 12:
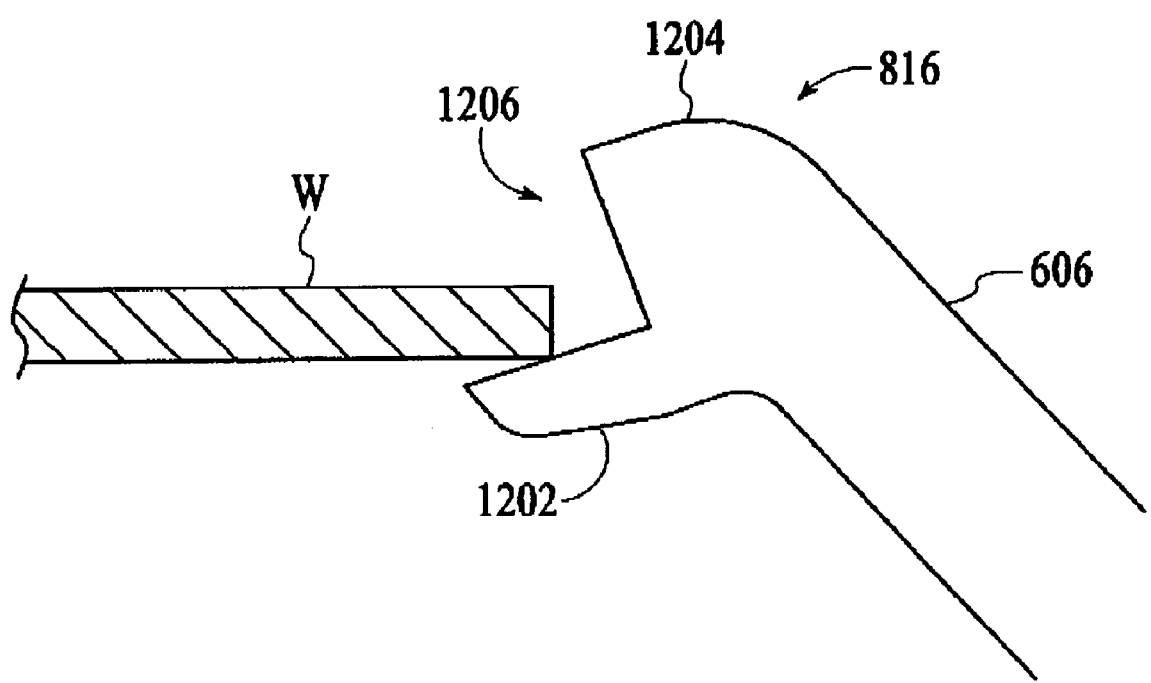
FIG. 12 illustrates the wafer engaging end of the confining member of the wafer holding mechanism of FIGS. 8, 9 and 10.

The wafer engaging end 816 of the confining member 606 includes a wafer supporting portion 1202 and a wafer confining portion 1204, as illustrated in FIG. 12. The wafer supporting portion 1202 and the wafer confining portion 1204 both protrude from the main body of the confining member 606, forming a concave-like confining region 1206. The wafer supporting portion 1202 allows the semiconductor wafer W to be supported by the pivotable confining members 606 of the wafer holding mechanisms 132A, 132B, 132C and 132D, when the wafer supporting assembly 112 is at rest, as illustrated in FIG. 11. However, when the wafer supporting assembly 112 is being rotated, each of the confining members 606 is pivoted to the wafer confining position such that the concave-like confining region 1206 applies pressure on the edge of the semiconductor wafer W in a radial direction toward the rotational axis R, thereby securely holding the wafer. In addition to forming the concave-like confining region 1206 with the wafer supporting portion 1202, the wafer confining portion 1204 is configured to partially extend over the semiconductor wafer W when the confining member 606 is pivoted to the wafer confining position, as illustrated in FIG. 11. Consequently, when the semiconductor wafer W is being rotated and held by the confining members 606 of the wafer holding mechanisms 132A, 132B, 132C and 132D, the wafer confining portions 1204 of the confining members provide an upward confinement of the wafer so that the wafer is not vertically thrown off the wafer supporting assembly 112. Similarly, the wafer supporting portion 1202 is configured to partially extend under the semiconductor wafer W when the confining member 606 is pivoted to the wafer receiving position, as illustrated in FIG. 12. In the exemplary embodiment, the wafer engaging end 816 of the confining member 606 is configured such that the concave-like confining region 1206 is V-shaped. However, the wafer engaging end 816 can be configured such that the concave-like confining region is shaped in other comparable configurations.

Figure 13:
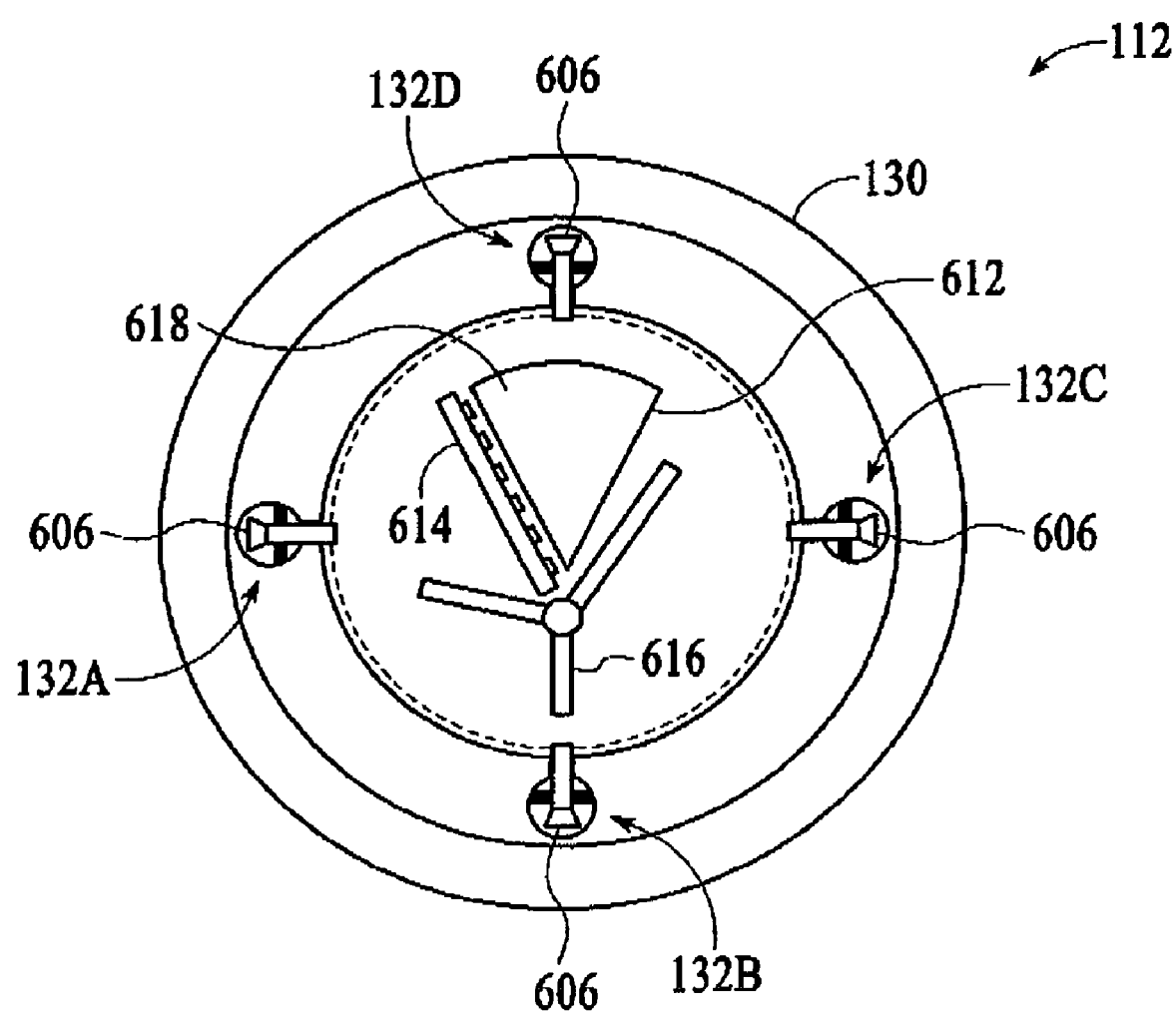
FIG. 13 is a top view of the wafer supporting assembly, illustrating an acoustic transducer, a fluid spraying unit and a wafer lifting member located within the wafer supporting assembly.

Turning back to FIG. 6, the cleaning system 100 further includes an acoustic transducer 612, a fluid spraying unit 614 and a wafer lifting member 616, which are located within the bowl-like upper portion 602 of the wafer supporting assembly 112. The relative positions of the acoustic transducer 612, the fluid spraying unit 614 and the wafer lifting member 616 within the bowl-like upper portion 602 are illustrated in FIG. 13, which is a top view of the wafer supporting assembly 112 with the semiconductor wafer W shown in phantom. The acoustic transducer 612 is configured to generate acoustic energy and to transmit the acoustic energy from an energy transmitting surface 618 of the acoustic transducer to the back surface of the semiconductor wafer W to assist in the cleaning of the wafer. The acoustic energy generated by the acoustic transducer 612 may be megasonic or ultrasonic. The energy transmitting surface 618 of the acoustic transducer 612 has a smaller surface area than the back surface of the semiconductor wafer W, as illustrated in FIG. 13. However, due to the rotation of the semiconductor wafer W, the acoustic energy from the acoustic transducer 612 can be applied to the entire back surface of the wafer. In the exemplary embodiment, the acoustic transducer 612 is shaped in a triangular configuration. Specifically, the acoustic transducer 612 is shaped like a piece of pie. However, the acoustic transducer 612 may be shaped in other configurations.

As shown in FIG. 6, the acoustic transducer 612 is connected to a positioning system 620, which can lower, raise and/or tilt the acoustic transducer so that the acoustic energy being applied to the back surface of the semiconductor wafer W can be controlled. Thus, the intensity of the acoustic energy being applied to the back surface of the semiconductor wafer W can be increased or decreased by vertically moving the acoustic transducer 612 closer to or farther from the back wafer surface. Furthermore, the intensity of the acoustic energy being applied near the center of the back surface of the semiconductor wafer W can be varied with respect to the intensity of the acoustic energy being applied near the edge of the back wafer surface by tilting the acoustic transducer 612. The intensity of the acoustic energy being applied near the center of the back wafer surface can be selectively increased or decreased by raising or lowering the front portion of the acoustic transducer 612, i.e., the portion of the acoustic transducer that is closest to the center of the back wafer surface. Similarly, the intensity of the acoustic energy being applied near the edge of the back wafer surface can be increased or decreased by raising or lowering the rear portion of the acoustic transducer 612, i.e., the portion of the acoustic transducer that is closest to the edge of the back wafer surface. The positioning system 620 may be designed to tilt the acoustic transducer 612 in any direction to vary the intensity of the acoustic energy being applied to different areas of the back wafer surface. The positioning system 620 is affixed to a stationary platform 622, which may be attached to a housing (not shown) of the cleaning system 100 via a post 624. The stationary platform 622 provides support for the positioning system and the acoustic transducer.

Figure 14:
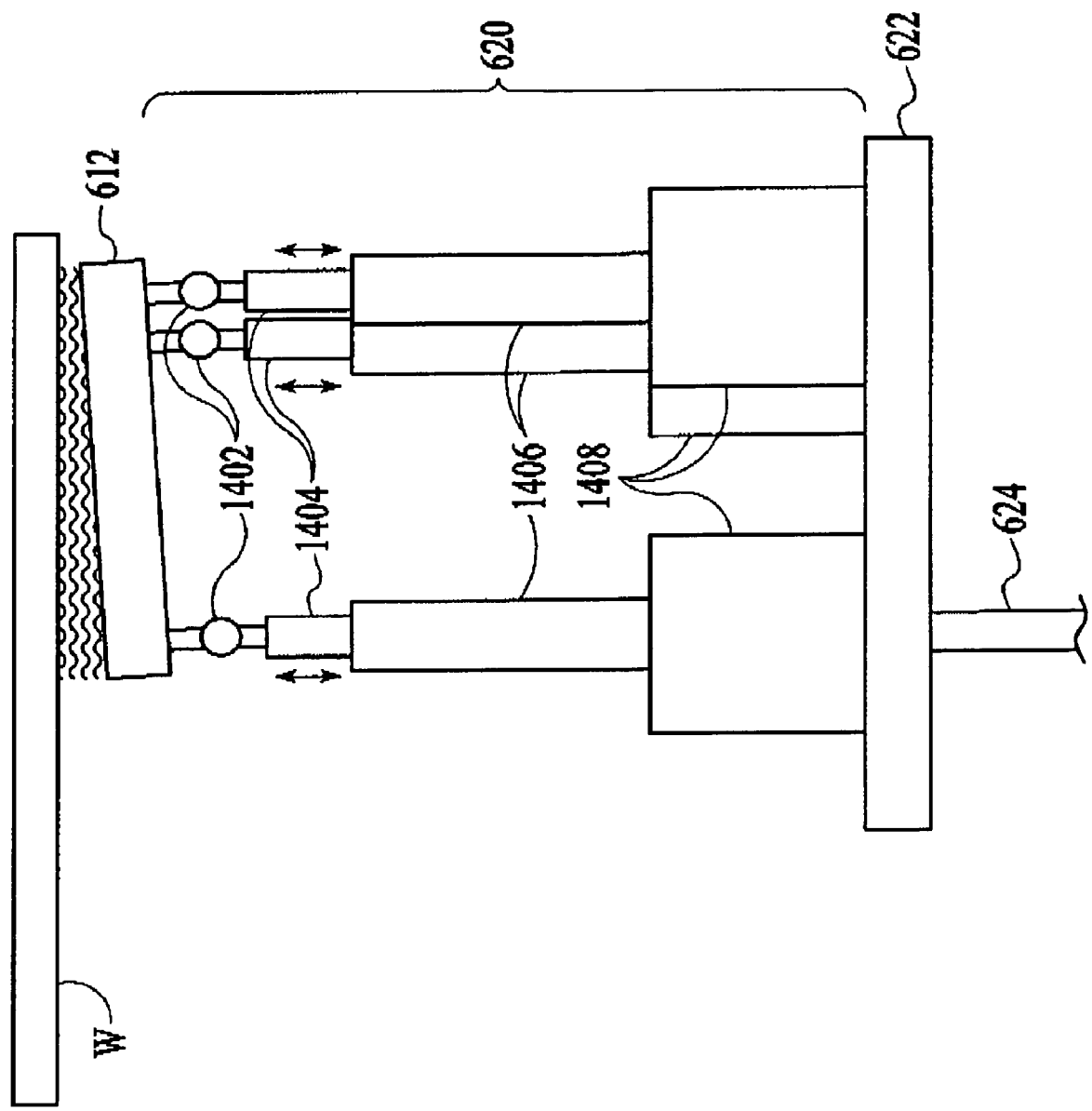
FIG. 14 illustrates a positioning system that is connected to the acoustic transducer.

As illustrated in FIG. 14, in the exemplary embodiment, the positioning system 620 includes three sets of a universal joint 1402, a positioning shaft 1404, a shaft guide 1406 and a shaft drive mechanism 1408, which are connected to each corner of the acoustic transducer 612 to selectively position the acoustic transducer relative to the back surface of the semiconductor wafer W. The shaft drive mechanisms 1408 are designed to independently extend and retract the respective positioning shafts 1404 along the respective shaft guides 1406 so that the acoustic transducer 612 can be raised, lowered and/or tilted. The universal joints 1402 provide lateral give so that the acoustic transducer 612 can be tilted by the positioning shafts 1404. In other embodiments, the positioning system 620 may include one or more additional sets of the universal joint 1402, the positioning shaft 1404, the shaft guide 1406 and the shaft drive mechanism 1408, depending on the shape of the acoustic transducer 612. As an example, if the acoustic transducer 612 is rectangular in shape, then the positioning system 620 may include four sets of the universal joint 1402, the positioning shaft 1404, the shaft guide 1406 and the shaft drive mechanism 1408 so that each corner of the acoustic transducer can be independently raised or lowered. Furthermore, in other embodiments, the positioning system 620 may include other components that can be used to raise, lower and/or tilt the acoustic transducer 612, instead of the universal joints 1402, the positioning shafts 1404, the shaft guides 1406 and the shaft drive mechanisms 1408. Although the acoustic transducer 612 and the positioning system 620 have been described as being positioned within the wafer supporting assembly 112 to apply acoustic energy to the back surface of the semiconductor wafer W, the acoustic transducer and the positioning system may be positioned over the wafer supporting assembly to apply acoustic energy to the front surface of the wafer.

As illustrated in FIG. 13, the fluid spraying unit 614 is positioned adjacent to the acoustic transducer 612. However, the fluid spraying unit 614 can be positioned at other locations within the bowl-like upper portion 602 of the cylindrical body 130 of the wafer supporting assembly 112. As shown in FIG. 6, the fluid spraying unit 614 is connected to a fluid supply (not shown) via a fluid delivery line 626. The fluid supply may be the same fluid supply that provides one or more cleaning fluids to the fluid dispensing unit 118. Alternatively, the fluid supply for the fluid spraying unit 614 may be a different fluid supply from the fluid supply for the fluid dispensing unit 118. The cleaning fluid supplied to the fluid spraying unit 614 may include DI water and/or any other cleaning fluid that can be used to clean a semiconductor wafer. The fluid spraying unit 614 may also be connected to a gas/fluid supply (not shown) via a gas/vapor delivery line 628 so that gas or vaporized fluid (vapor) can be applied to the back surface of the semiconductor wafer W, as well as the cleaning fluids. The gas/vapor delivery line 628 may be used to supply vaporized Isopropyl Alcohol (IPA) to the back surface of the semiconductor wafer W for a rinse and dry process, during which DI water and vaporized IPA are supplied to the back wafer surface to rinse and spin-dry the back surface. However, the gas/vapor delivery line 628 can be used to supply any gas or vapor to the back wafer surface.

In the embodiment shown in FIG. 6, the fluid spraying unit 614 is a bar-type unit that extends across at least half of the diameter of the semiconductor wafer W. In this embodiment, the fluid spraying unit 614 includes a number of nozzles or openings along the length of the unit, as illustrated in FIG. 13, to spray one or more cleaning fluids and/or to eject gas/vapor onto the back surface of the semiconductor wafer W so that the cleaning fluids and/or gas/vapor can be applied to the entire back wafer when the wafer is rotated. Thus, some of the nozzles or openings of the fluid spraying unit 614 may be used to spray the cleaning fluids, while other nozzles or openings may be used to eject the gas/vapor. As shown in FIG. 6, the fluid spraying unit 614 is attached to a shaft 630, which may be connected to a vertical drive mechanism 632. The vertical drive mechanism 632 is configured to raise and lower the fluid spraying unit 614 so that the fluid spraying unit can be moved closer to or farther from the back surface of the semiconductor wafer W. Alternatively, the shaft 630 may be simply attached to the housing (not shown) of the cleaning system 100 such that the fluid spraying unit 614 is positioned at a fixed distance from the back surface of the semiconductor wafer W.

Figure 16:
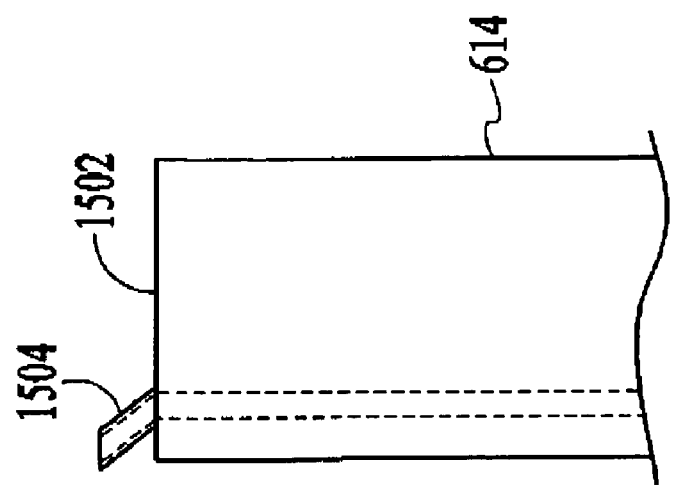
FIG. 16 is a cross-sectional view of the fluid spraying unit of FIG. 15.
Figure 15:
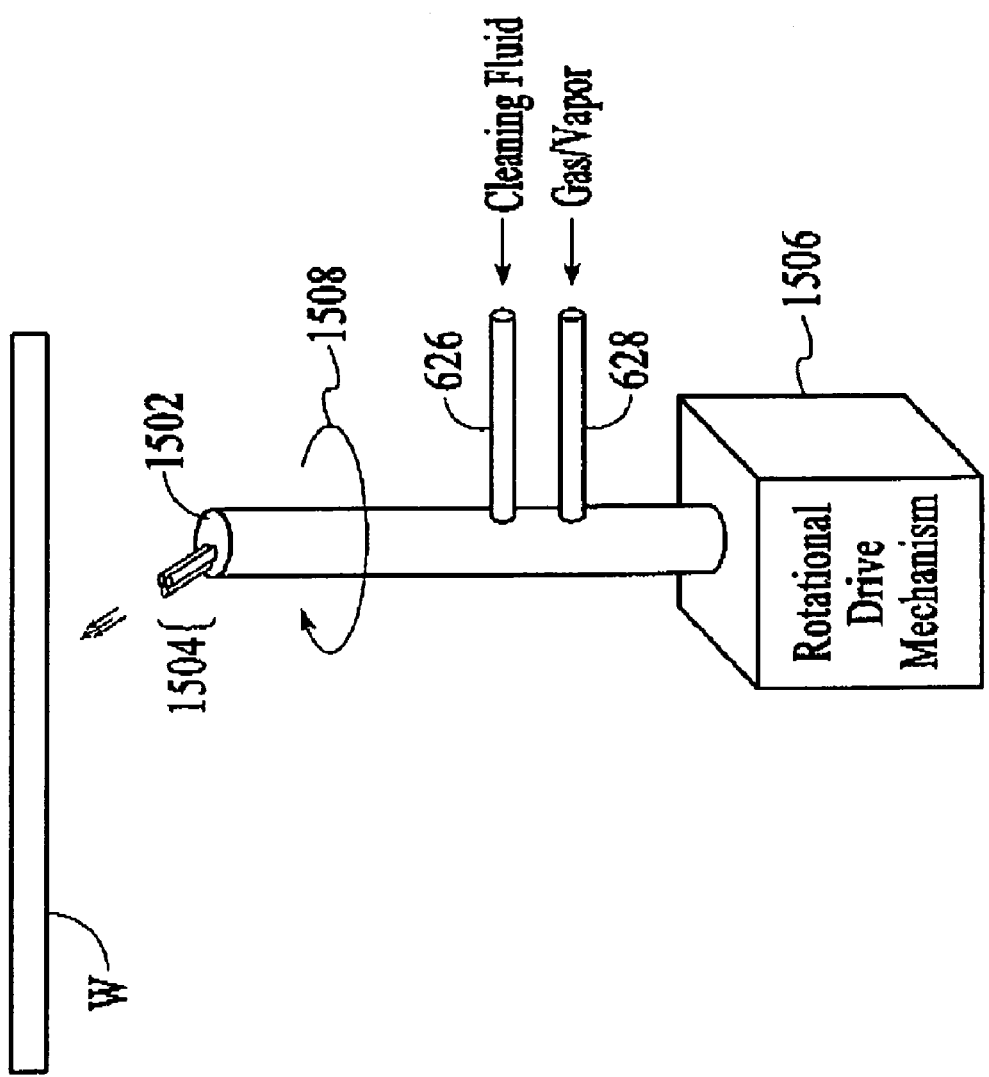
FIG. 15 illustrates the fluid spraying unit in accordance with an alternative embodiment of the invention.

In another embodiment, as illustrated in FIG. 15, the fluid spraying unit 614 is a cylinder-type unit that is vertically positioned such that a circular surface 1502 with one or more nozzles 1504 faces the back surface of the semiconductor wafer W. As illustrated in FIG. 16, which is a cross-sectional view of the fluid spraying unit 614 of FIG. 15 across one of the nozzles 1504, each of the nozzles 1504 is angled such that one or more cleaning fluids and/or gas/vapor are projected at an angle from the fluid spraying unit. In this embodiment, the fluid spraying unit 614 is connected to a rotational drive mechanism 1506 that can rotate the fluid spraying unit about its axis, as indicated by the arrow 1508. Preferably, the nozzles 1504 of the fluid spraying unit 614 are angled such that the cleaning fluids and/or the gas/vapor can be projected toward a targeted region of the back surface of the semiconductor wafer W between the center of the back wafer surface and the edge of the back wafer surface, depending on the rotational position of the fluid spraying unit. Thus, the cleaning fluids and/or the gas/vapor from the fluid spraying unit 614 can be applied across the back surface of the semiconductor wafer W in a scanning fashion from the center of the back surface to the edge of the back surface by rotating the fluid spraying unit, which may reduce or eliminate contaminants, such as particles, that may be left on the back wafer surface when the surface is rinsed and spin-dried using DI water and vaporized IPA.

Figure 18:
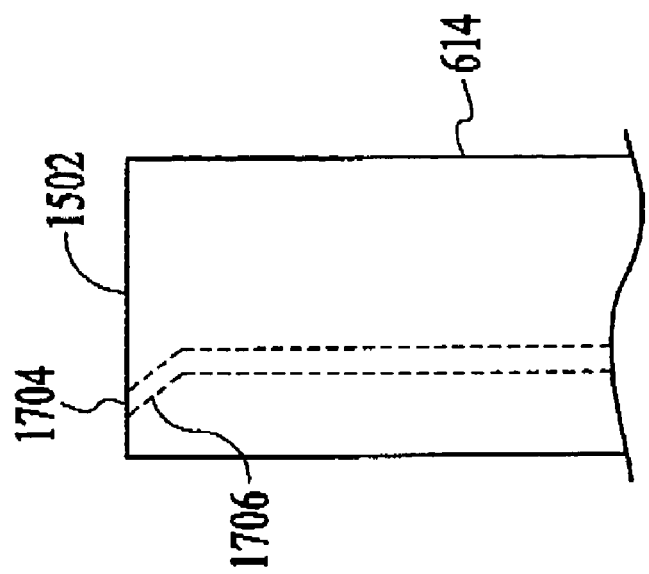
FIG. 18 is a cross-sectional view of the fluid spraying unit of FIG. 17.
Figure 17:
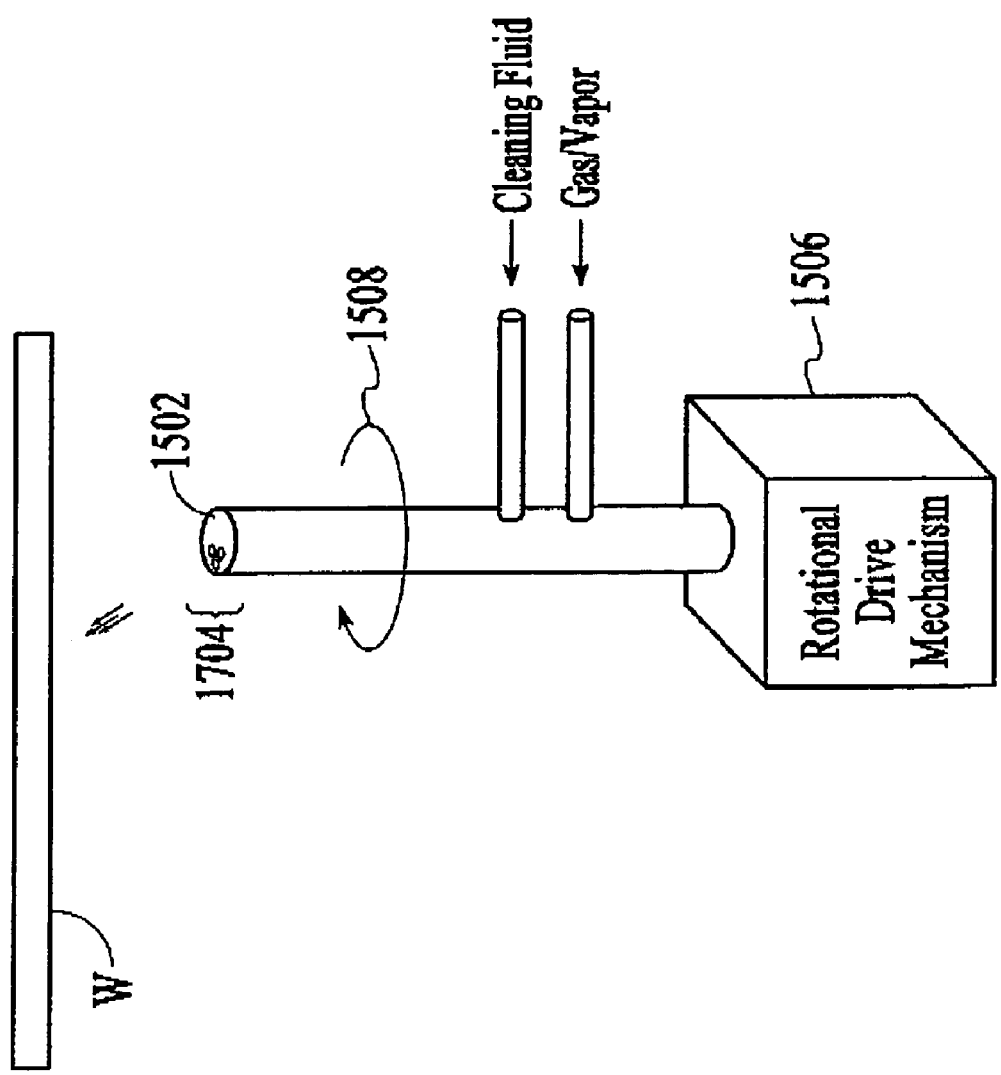
FIG. 17 illustrates the fluid spraying unit in accordance with an alternative configuration of the alternative embodiment.

In FIG. 17, the fluid spraying unit 614 of FIG. 15 in an alternative configuration is shown. In this configuration, the nozzles 1504 of fluid spraying unit 614 are replaced with openings 1704. Furthermore, conduits 1706 that lead to the openings 1704 are angled, as illustrated in FIG. 18, which is a cross-sectional view of the fluid spraying unit 614 of FIG. 17 across one of the openings 1704, so that the cleaning fluids and/or the gas/vapor are sprayed at an angle onto the back surface of the semiconductor wafer W.

Figure 19:
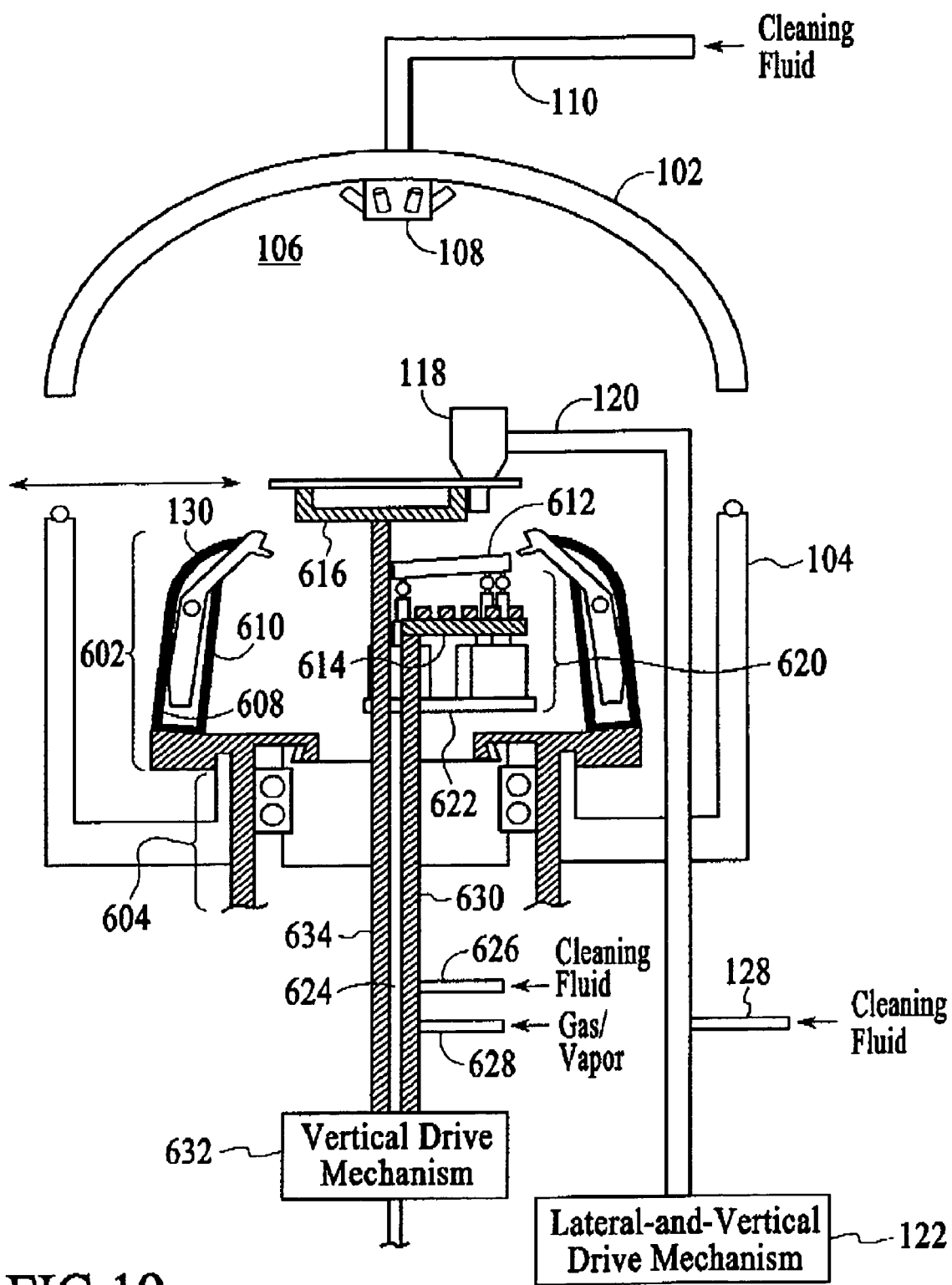
FIG. 19 is another diagram of the cleaning system of FIG. 1, illustrating the operation of the wafer lifting member to load and/or unload a semiconductor wafer.

Turning back to FIG. 6, the wafer lifting member 616 of the cleaning system 100 is designed to lift and lower a semiconductor wafer, such as the semiconductor wafer W, to relay the semiconductor wafer between the confining members 606 of the wafer supporting assembly 112 and a wafer transport device (not shown), such as an external robotic arm. Thus, the wafer lifting member 616 is used to load a new semiconductor wafer onto the wafer supporting assembly 112 and to unload a cleaned semiconductor wafer from the wafer supporting assembly. The wafer lifting member 616 is attached to a shaft 634, which may be connected to the vertical drive mechanism 632, or to another vertical drive mechanism (not shown). The vertical drive mechanism 632 is configured to raise and lower the wafer lifting member 616 by extending and retracting the shaft 634. When the wafer lifting member 616 is raised to a load/unload position, as shown in FIG. 19, a new semiconductor wafer to be cleaned can be placed on the wafer lifting member by the wafer transport device (not shown). The semiconductor wafer can then lowered by the wafer lifting member 616 so that the wafer is supported by the confining members 606 of the wafer supporting assembly 112. After the semiconductor wafer has been cleaned, the wafer is lifted back to the load/unload position by the wafer lifting member 616 so that the wafer can be transported to, for example, another wafer processing system. A new semiconductor wafer to be cleaned can then be placed on the wafer lifting member 616, and the process can then be repeated for the new wafer.

Figure 20:
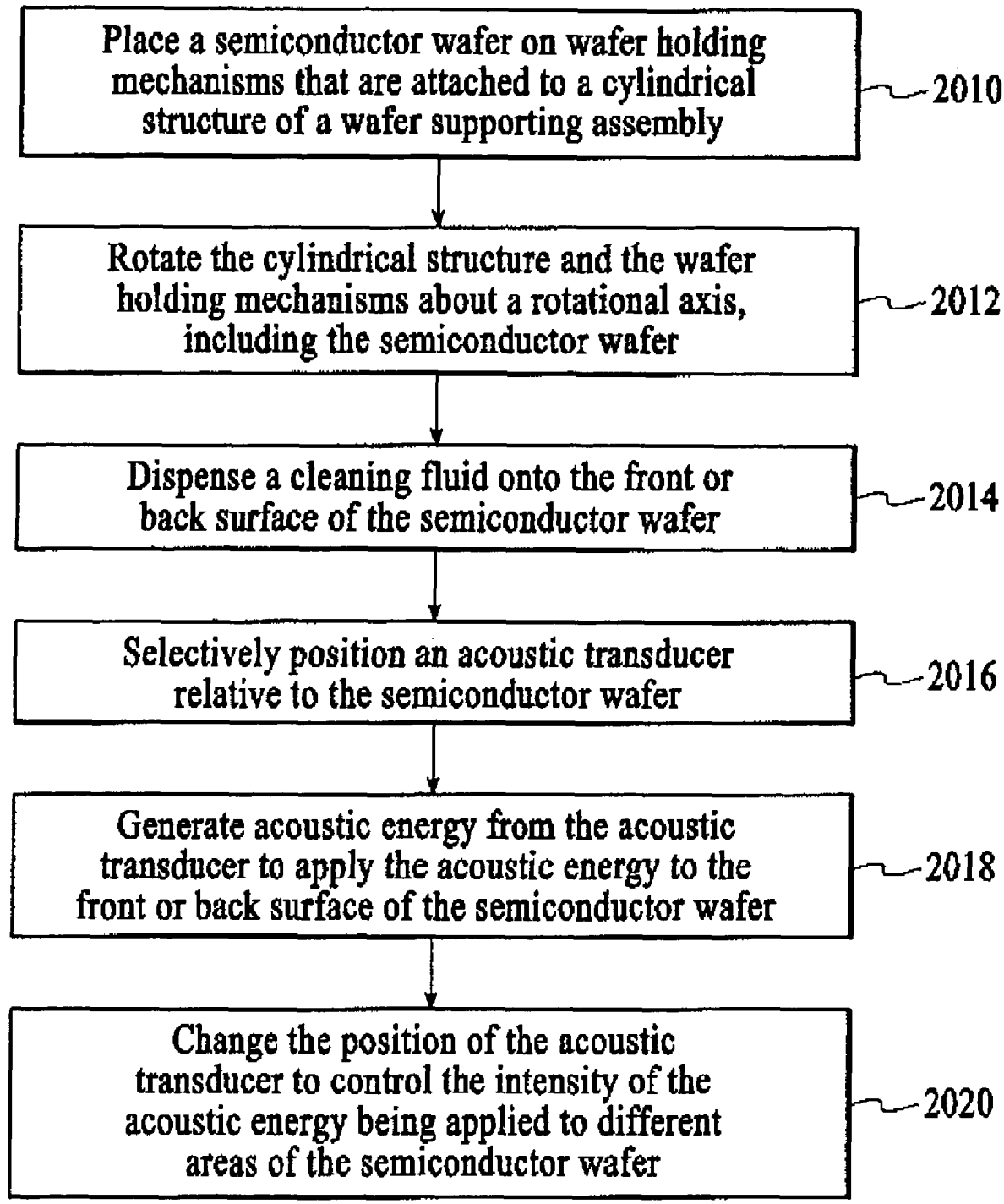
FIG. 20 is a process flow diagram of a method of cleaning a semiconductor wafer in accordance with an exemplary embodiment of the invention.

A method for cleaning a semiconductor wafer in accordance with an exemplary embodiment of the invention is described with reference to the flow diagram of FIG. 20. At block 2010, the semiconductor wafer is placed on wafer holding mechanisms that are attached to a cylindrical structure of a wafer supporting assembly such that the wafer is supported near an opening of the cylindrical structure. At block 2012, the cylindrical structure and the wafer holding mechanisms are rotated about a rotational axis. Furthermore, at block 2012, the semiconductor wafer is held by the wafer holding mechanisms such that the wafer is also rotated along with the cylindrical structure and the wafer holding mechanisms. Each wafer holding mechanism may include a confining member that pivots when subjected to centrifugal force caused by the rotation of the wafer holding mechanisms about the rotational axis. The wafer holding mechanisms are configured such that the pivoting of the confining members applies a pressure on the edge of the semiconductor wafer toward an inward radial direction to securely hold the wafer. At block 2014, a cleaning fluid is dispensed onto the front or back surface of the semiconductor wafer. At block 2016, an acoustic transducer is selectively positioned relative to the semiconductor wafer. At block 2018, an acoustic energy is generated from the acoustic transducer to apply the acoustic energy to the front or back surface of the semiconductor wafer to assist in the cleaning of the wafer. At block 2020, the position of the acoustic transducer can be changed to control the intensity of the acoustic energy being applied to different areas of the semiconductor wafer.

Although specific embodiments of the invention have been described and illustrated, the invention is not to be limited to the specific forms or arrangements of parts so described and illustrated. As an example, the invention may be used to process substrates other than semiconductor wafers, such as LCD substrates. The scope of the invention is to be defined by the claims appended hereto and their equivalents.

What is claimed is:

1. A system for cleaning a substrate comprising:
a substrate supporting assembly configured to hold said substrate such that an upper surface and a lower surface of said substrate are exposed;
a fluid dispensing device positioned relative to said substrate supporting assembly to dispense a cleaning fluid onto said upper surface of said substrate;
an acoustic energy generator positioned relative to said substrate supporting assembly to apply acoustic energy to said lower surface of said substrate, said acoustic energy generator being positioned below said substrate when said substrate is supported by said substrate supporting assembly to apply said acoustic energy directly to said lower surface of said substrate; and
a positioning system connected to said acoustic energy generator to selectively position said acoustic energy generator with respect to said substrate, said positioning system being configured to raise and lower said acoustic energy generator to change a vertical distance between said substrate and at least a portion of said acoustic energy generator such that intensity of said acoustic energy at different areas of said substrate can be controlled, said positioning system including multiple positioning shafts connected to said acoustic energy generator, each of said multiple positioning shafts being connected to a shaft drive mechanism to independently displace each of said multiple positioning shafts to raise, lower and tilt said acoustic energy generator with respect to said lower surface of said substrate.

2. The system of claim 1 wherein said acoustic energy generator is shaped in a triangular configuration.

3. The system of claim 2 wherein said acoustic energy generator is configured to generate megasonic or ultrasonic energy.

4. The system of claim 1 further comprising a bar-type fluid dispensing unit having at least one opening to dispense a second cleaning fluid onto one of said first and second surfaces of said substrate across a substantial portion of said substrate.

5. The system of claim 1 further comprising a cylinder-type fluid dispensing unit having at least one opening configured to dispense a second cleaning fluid onto one of said first and second surfaces at an angle, said cylinder-type fluid dispensing unit being rotatable about a longitudinal axis such that said second cleaning fluid from said at least one opening can be applied across one of said first and second surfaces in a scanning fashion.

6. The system of claim 1 further comprising a cleaning chamber and a chamber-cleaning device attached to said cleaning chamber, said chamber-cleaning device including at least one opening to spray a second cleaning fluid onto the interior surface of said cleaning chamber to clean said cleaning chamber.

7. The system of claim 1 further comprising a rotational drive mechanism operatively connected to said substrate supporting assembly to rotate said substrate supporting assembly about a rotational axis, and wherein said substrate supporting assembly includes:
a rotatable cylindrical structure having an opening to accommodate said substrate; and
a plurality of substrate holding mechanisms attached to said rotatable cylindrical structure, said substrate holding mechanisms being configured to hold said substrate near said opening of said rotatable cylindrical structure.

8. The system of claim 7 wherein each of said substrate holding mechanisms includes a confining member that is designed to apply a pressure on an edge of said substrate in a radial direction toward said rotational axis when subjected to centrifugal force caused by a rotation of said substrate holding mechanisms.

9. The system of claim 8 wherein said confining member has a substrate engaging end that is configured to support said substrate and to apply said pressure on said edge of said substrate.

10. The system of claim 9 wherein said confining member is configured to be pivoted about a pivoting axis when subjected to said centrifugal force such that said substrate engaging end of said confining member applies said pressure on said edge of said substrate in said radial direction when said confining member is pivoted.

11. The system of claim 10 wherein said cylindrical structure includes outer and inner side walls that are designed to restrict pivoting movement of said confining member.

12. The system of claim 9 wherein said substrate engaging end of said confining member includes a first protruding portion to support said substrate when said substrate holding mechanisms are at rest.

13. The system of claim 12 wherein said substrate engaging end of said confining member includes a second protruding portion that forms a confining region with said first protruding portion, said confining region being configured to engage said edge of said substrate to apply said pressure when said confining member is subjected to said centrifugal force.

14. The system of claim 1 wherein said acoustic energy generator is located within said substrate supporting assembly to apply said acoustic energy to said lower surface of said substrate.

15. The system of claim 1 further comprising another fluid dispensing device positioned relative to said substrate supporting assembly to dispense another cleaning fluid onto said lower surface of said substrate.

* * * * *